(12) United States Patent
Kanakasabapathy et al.

(10) Patent No.: US 9,064,813 B2
(45) Date of Patent: Jun. 23, 2015

(54) TRENCH PATTERNING WITH BLOCK FIRST SIDEWALL IMAGE TRANSFER

(71) Applicant: International Business Machines Corporation, Armonk, NY (US)

(72) Inventors: Sivananda K. Kanakasabapathy, Niskayuna, NY (US); Chiahsun Tseng, Wynantskill, NY (US); Yongan Xu, Albany, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 13/866,293

(22) Filed: Apr. 19, 2013

(65) Prior Publication Data

US 2014/0315380 A1    Oct. 23, 2014

(51) Int. Cl.
| | |
|---|---|
| H01L 21/47 | (2006.01) |
| H01L 21/31 | (2006.01) |
| H01L 21/30 | (2006.01) |
| H01L 21/308 | (2006.01) |
| H01L 21/768 | (2006.01) |

(52) U.S. Cl.
CPC ...... *H01L 21/3083* (2013.01); *H01L 21/76802* (2013.01); *H01L 21/3081* (2013.01); *H01L 21/76801* (2013.01)

(58) Field of Classification Search
CPC .......... H01L 21/30; H01L 21/20; H01L 21/31
USPC ......... 438/618, 424, 427, 462, 700–703, 717, 438/719, 736–738; 257/773–774, 797, 257/E21.235, E21.238, E21.257, E21.258, 257/E21.264, E21.26; 216/41, 46, 47, 79
See application file for complete search history.

(56) References Cited

U.S. PATENT DOCUMENTS

| | | | |
|---|---|---|---|
| 7,241,681 | B2 | 7/2007 | Kumar et al. |
| 7,265,013 | B2 | 9/2007 | Furukawa et al. |
| 2004/0018738 | A1* | 1/2004 | Liu ............................ 438/700 |
| 2005/0208742 | A1 | 9/2005 | America et al. |
| 2006/0046422 | A1* | 3/2006 | Tran et al. .................... 438/401 |
| 2006/0046484 | A1* | 3/2006 | Abatchev et al. ............. 438/689 |
| 2007/0049040 | A1* | 3/2007 | Bai et al. ...................... 438/712 |
| 2007/0099431 | A1* | 5/2007 | Li ................................. 438/735 |
| 2008/0006852 | A1 | 1/2008 | Beintner et al. |
| 2010/0105210 | A1* | 4/2010 | Chen et al. ................... 438/702 |
| 2011/0014786 | A1* | 1/2011 | Sezginer et al. ............. 438/618 |

(Continued)

OTHER PUBLICATIONS

Huixiong Dai et al.; "45nm and 32nm Half-Pitch Patterning with 193nm Dry Lithography and Double Patterning" Proceedings of the SPIE, vol. 6924, pp. 692421-1-692421-7 (2008).

*Primary Examiner* — Amar Movva
*Assistant Examiner* — Sheikh Maruf
(74) *Attorney, Agent, or Firm* — L. Jeffrey Kelly; Yuanmin Cai

(57) ABSTRACT

A method including forming a tetra-layer hardmask above a substrate, the tetra-layer hardmask including a second hardmask layer above a first hardmask layer; removing a portion of the second hardmask layer of the tetra-layer hardmask within a pattern region of a structure comprising the substrate and the tetra-layer hardmask; forming a set of sidewall spacers above the tetra-layer hardmask to define a device pattern; and transferring a portion of the device pattern into the substrate and within the pattern region of the structure.

17 Claims, 11 Drawing Sheets

(56) References Cited

U.S. PATENT DOCUMENTS

| | | | |
|---|---|---|---|
| 2011/0207329 A1* | 8/2011 | Shih et al. | 438/702 |
| 2012/0181705 A1* | 7/2012 | Tang et al. | 257/774 |
| 2012/0208356 A1 | 8/2012 | Furukawa et al. | |
| 2012/0244711 A1 | 9/2012 | Yin et al. | |
| 2013/0189845 A1* | 7/2013 | Kim et al. | 438/696 |
| 2014/0024220 A1* | 1/2014 | Chang et al. | 438/710 |
| 2014/0273496 A1* | 9/2014 | Kao et al. | 438/743 |
| 2014/0291735 A1* | 10/2014 | Shen et al. | 257/288 |

\* cited by examiner

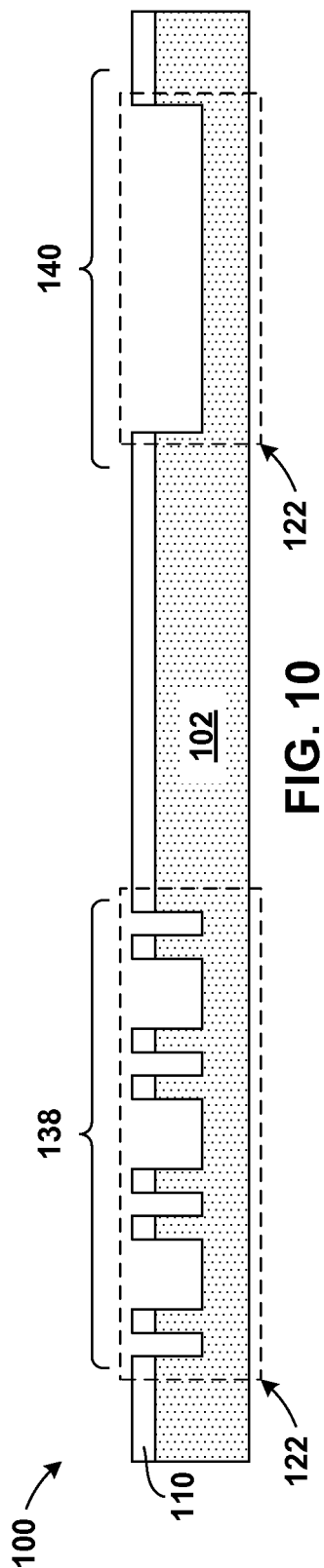

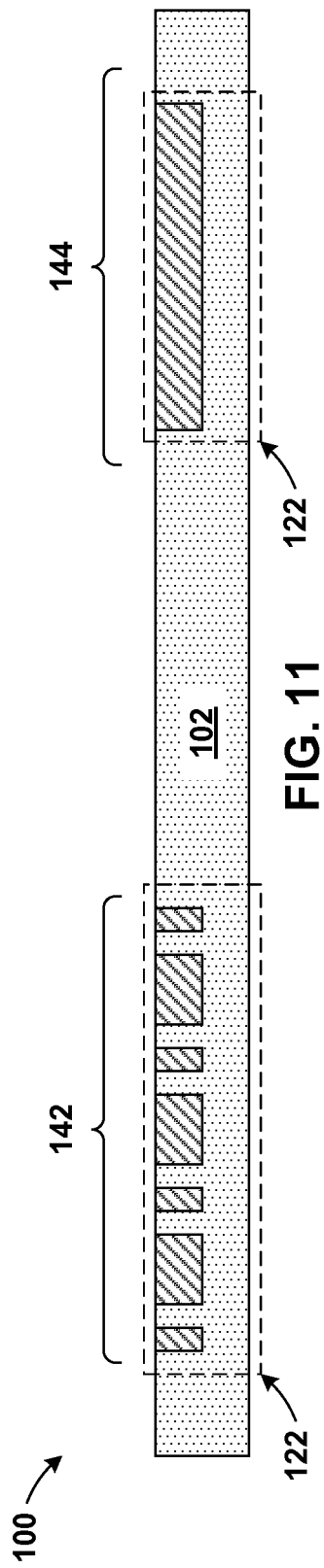

TRENCH PATTERNING WITH BLOCK FIRST SIDEWALL IMAGE TRANSFER

BACKGROUND

The present invention generally relates to semiconductor device manufacturing, and more particularly to trench patterning using a block first sidewall image transfer technique.

Semiconductor device manufacturing generally includes various steps including a patterning process. For example, the manufacturing of a semiconductor chip may start with, for example, CAD (computer aided design) generated device patterns and may continue with the effort to replicate these device patterns in a substrate in which semiconductor devices can be formed. The replication process may involve the use of a photolithography process in which a layer of photo-resist material may be first applied on top of a substrate, and then be selectively exposed according to a pre-determined device pattern. Portions of the photo-resist that are exposed to light or other ionizing radiation (e.g., ultraviolet, electron beams, X-rays, etc.) may experience some changes in their solubility to a certain solution. Next, the photo-resist may be developed in a developer solution, thereby removing the non-irradiated (in a negative resist) or irradiated (in a positive resist) portions of the resist layer, to create a photo-resist pattern. The photo-resist pattern may subsequently be copied or transferred to the substrate underneath the photo-resist pattern.

Engineers are continuously facing the challenge of how to meet the market demand for ever increasing device density. One technique for tight pitch patterning is to achieve twice the pattern density through a technique called sidewall image transfer (SIT), also known as sidewall spacer image transfer. A conventional block last SIT process can include lithographically forming a mandrel above a substrate from a suitable photo-resist material. A material suitable for forming spacers is subsequently deposited on top of the mandrel and to eventually form spacers next to the mandrels. The mandrel can then be removed and the remaining spacers can defined the desired device pattern. Next, a block mask litho step may be applied to remove a portion of the device pattern formed by the spacers. The block mask litho step may be designed to define a pattern region of the structure, and thus ensure only a portion of the device pattern within the pattern region is transferred to underlying layers and eventually the substrate. Lastly, the device pattern may be transferred into an underlying substrate, again, only within the pattern region defined by the block mask litho step.

However, concerns and issues have been observed in the above block last SIT process. Accordingly it may be advantageous to make changes to the current fabrication techniques to address the deficiencies described above.

SUMMARY

According to one embodiment of the present invention, a method is provided. The method may include forming a tetra-layer hardmask above a substrate, the tetra-layer hardmask including a second hardmask layer above a first hardmask layer, removing a portion of the second hardmask layer of the tetra-layer hardmask within a pattern region of a structure including the substrate and the tetra-layer hardmask, forming a set of sidewall spacers above the tetra-layer hardmask to define a device pattern, and transferring a portion of the device pattern into the substrate and within the pattern region of the structure.

According to another exemplary embodiment of the present invention, a method is provided. The method may include forming a tetra-layer hardmask including a second hardmask layer above a first hardmask layer, defining a pattern region in the second hardmask layer, forming a device pattern above the tetra-layer hardmask, and transferring the device pattern to a substrate below the tetra-layer hardmask, where the device pattern is transferred to the substrate only in the pattern region defined by the second hardmask layer.

According to another exemplary embodiment of the present invention, a method is provided. The method may include forming a tetra-layer hardmask above a substrate, the tetra-layer hardmask including a first patterning layer, a first hardmask layer, a second patterning layer, and a second hardmask layer all of which are formed one top of one another and in sequence, forming a block pattern from a photo-resist material above the tetra-layer hardmask, and transferring the block pattern from the photo-resist material to the second hardmask layer, where the block pattern in the second hardmask layer defines a pattern region. The method may further include forming a device pattern using a set of sidewall spacers above the second hardmask layer, transferring the device pattern into the first hardmask layer, only within the pattern region, and transferring the device pattern into the substrate, only within the pattern region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 10 illustrates transferring the first and second device patterns from the first hardmask layer to a substrate according to an exemplary embodiment.

FIG. 11 illustrates a final structure according to an exemplary embodiment.

Figure 1:
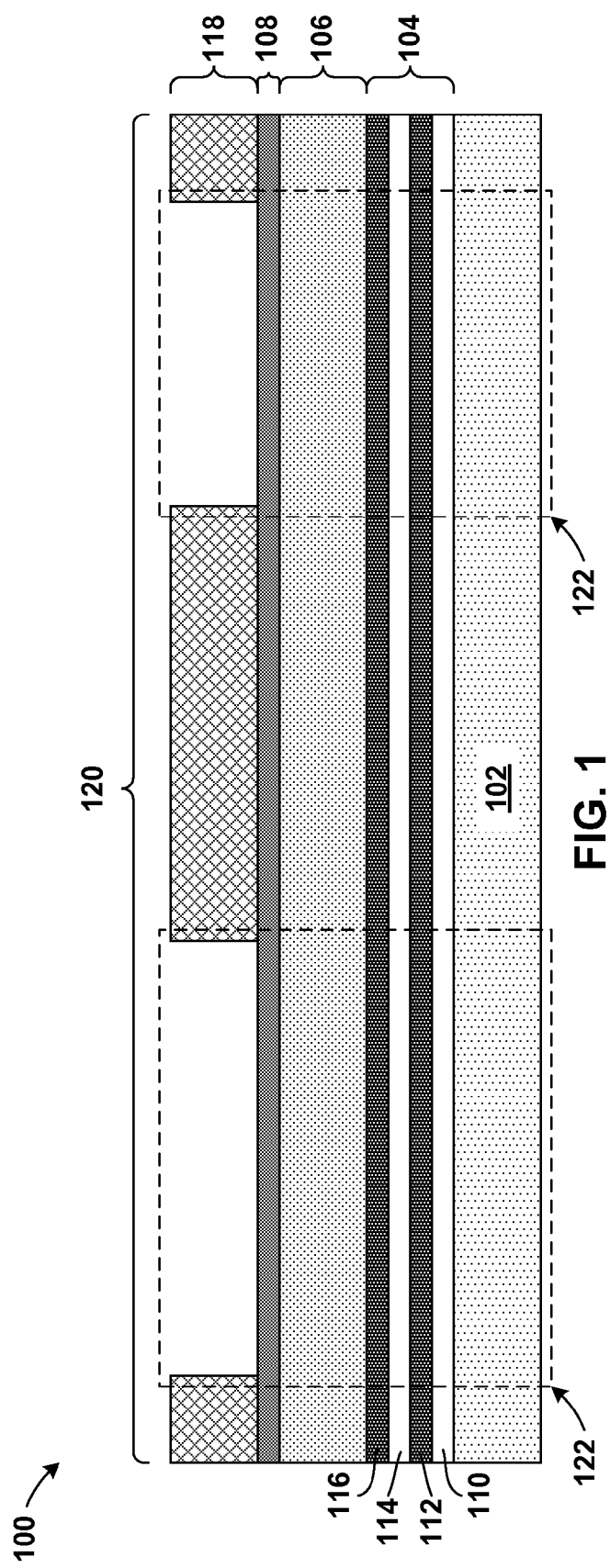
FIG. 1 is a cross-sectional view of a structure at an intermediate step of fabrication in which the formation of a block pattern is illustrated according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Current block last sidewall image transfer (SIT) techniques described above may have drawbacks including, for example, a limited process window in which the spacer height must be high or thick enough to function as an etch mask in one sense while at the same time short enough to ultimately be sacrificially removed before being transferred into underlying layers in a subsequent step. Also, the block last SIT technique can produce a segmented or hollow alignment mark which may be used for alignment during subsequent processing steps. The segmented or hollow alignment marks offer poor contrast making alignment for future processing difficult. The present invention generally relates to trench patterning using a block first SIT technique which may address one or more of the deficiencies described above.

Referring now to FIGS. 1-11, exemplary process steps of forming a structure 100 in accordance with one embodiment of the present invention are shown, and will now be described in greater detail below. The structure 100 can include a device pattern. Some non-limiting examples of the device pattern can include, for example, a back-end-of-line (BEOL) or mid-of-line (MOL) interconnect structure, a front-end-of-line (FEOL) device structure which includes, for example, a high-k metal gate semiconductor transistor devices, or an alignment mark used for alignment and registration purposes between subsequent fabrication processing steps. The alignment mark can generally be fabricated in a sacrificial region, or kerf, of a wafer. In some instances the alignment mark can be adjacent to the device pattern. In the present embodiment, the fabrication of an interconnect structure can be illustrated generally on the left side of the structure 100, and the fabrication of an alignment mark can be illustrated on the right side of the structure 100.

It should be noted that FIGS. 1-11 all represent a cross section view of a wafer having a substrate. The substrate may include a semiconductor material or a dielectric material. In the present embodiment, a first device pattern and a second device pattern can be formed in a dielectric layer using a block first sidewall image transfer technique, described in detail below. The block first SIT technique can include a block patterning technique followed by a device patterning technique. The interconnect structure can be formed from the first device pattern and the alignment mark can be formed from the second device pattern. Both the first and second device patterns are fabricated concurrently, and simultaneously undergo the same or similar processing techniques. It should be noted that while this description may refer to some components of the structure 100 in the singular tense, more than one component may be depicted throughout the figures and like components are labeled with like numerals. For example, the specific number of sets of spacers illustrated in the device patterning process is chosen is for illustrative purposes only.

FIG. 1 is a demonstrative illustration of a structure during an intermediate step of a method of forming a first device pattern and a second device pattern through a block first SIT process according to one embodiment. More specifically, the method can start with forming a stack of layers on top of a substrate 102 in which the first and second device patterns are to be formed. Again, in the present embodiment, the first device pattern can produce an interconnect structure and the second device pattern can produce an alignment mark, both formed in the substrate 102. The stack of layers can include, for example and starting from the substrate 102, a tetra-layer hardmask 104, a block planarization layer 106, and a block anti-reflective coating layer 108 (hereinafter "block ARC" layer), all of which can be formed on top of one another and in sequence. The tetra-layer hardmask 104 can further include, for example, a first patterning layer 110, a first hardmask layer 112, a second patterning layer 114, and a second hardmask layer 116 all of which can be formed one top of one another and in sequence.

In one embodiment, the substrate 102 at the bottom of the stack can be any dielectric materials suitable for BEOL or MOL interconnect structures. In an alternative embodiment the substrate 102 can be any gate materials suitable for FEOL structures. In other embodiments, the substrate 102 can be a semiconductor material or a dielectric material on top of a semiconductor material. The first and second patterning layers 110, 114 can include silicon oxide and can be formed, for example, from a tetraethyl orthosilicate (TEOS) precursor to have a thickness, in some embodiments, ranging from about 10 nanometers (nm) to about 100 nm. The first and second hardmask layers 112, 116 can include a metal-nitride, such as titanium-nitride (TiN), boron-nitride (BN), or a metal-oxide and can have a thickness, in some embodiments, ranging from about 10 nm to about 70 nm. The first and second hardmask layers 112, 114 can preferably, although not necessarily, be formed to have the same or close to the same thickness to facilitate an etching process as described in more detail below. The block planarization layer 106 can be an organic planarization layer (OPL) or a layer of material that is capable of being planarized by known chemical mechanical polishing techniques. In one embodiment, for example, the block planarization layer 106 can be an amorphous carbon layer that can be able to withstand the high process temperatures of subsequent processing steps. The block planarization layer 106 can preferably have a thickness ranging from about 10 nm to about 300 nm. The block ARC layer 108 can include silicon (Si) and in some embodiments can be referred to as a SiARC layer or a bottom anti-reflective coating layer (BARC). The block ARC layer 108 can have a thickness ranging from about 10 nm to about 100 nm in some embodiments.

With continued reference to FIG. 1, a block pattern 120 can be generated using known photolithography and masking techniques. This step, which can be referred to as a block litho step or a block patterning step, can be performed to block or prevent a portion of a subsequently formed device patterns from being transferred to the substrate 102 in a subsequent step. During this step, a photo-resist layer 118 can be formed on top of the block ARC layer 108. The photo-resist layer 118 can include any suitable photo-resist material. The particular photo-resist material chosen can partly depend upon the desired pattern to be formed and the exposure method used. In one embodiment, the photo-resist layer 118 can include a single exposure resist suitable for, for example, argon fluoride (ArF); a double exposure resist suitable for, for example, thermal cure system; or an extreme ultraviolet (EUV) resist suitable for, for example, an optical process. In one embodiment, the photo-resist layer 118 can be formed with a thickness ranging from about 30 nm to about 150 nm. The photo-resist layer 118 can then be lithographically exposed and developed to create the block pattern 120. The block pattern 120 can be formed by applying any appropriate photo-exposure method suitable to the type of photo-resist layer being used, as is well known in the art. The block pattern 120 of the block patterning step can define a pattern region 122 of the structure 100. The pattern region 122 can be distinguished from the remainder of the structure 100, in that a subsequent device patterns can only be transferred to the underlying substrate 102 in the pattern region 122.

Figure 2:
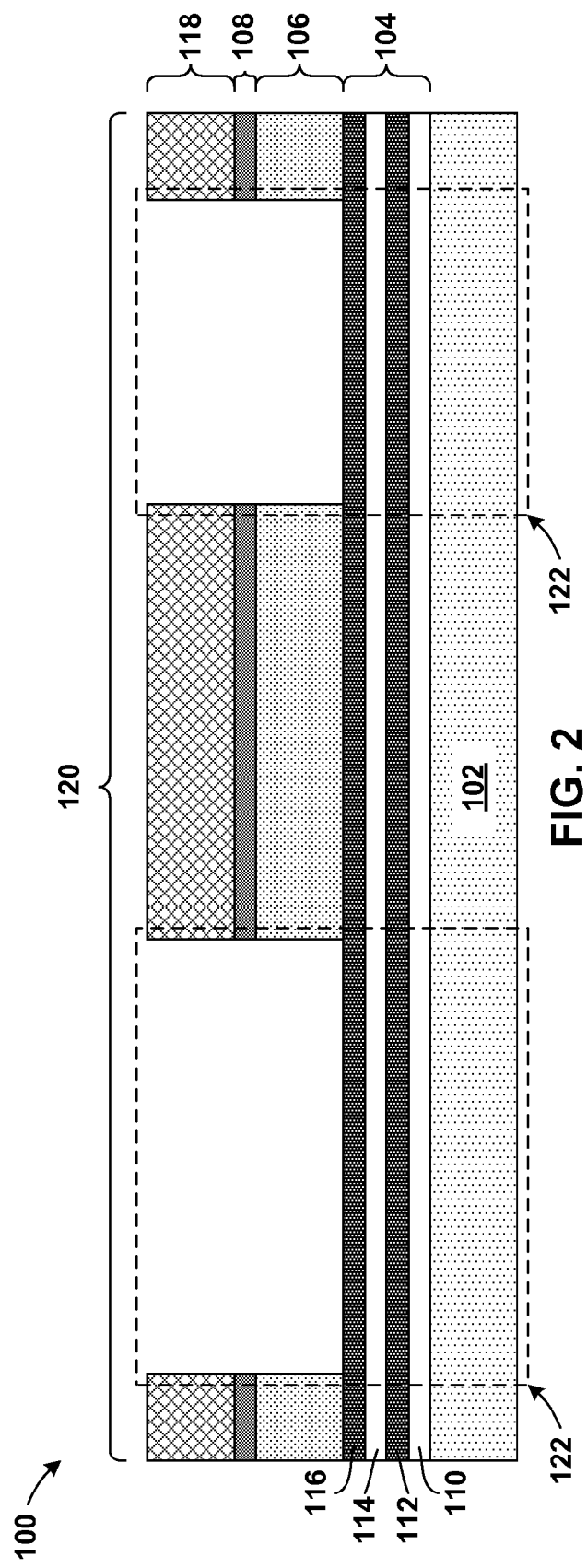
FIG. 2 illustrates transferring the block pattern into a block ARC layer and a block planarization layer according to an exemplary embodiment.

FIG. 2 is a demonstrative illustration of a structure during an intermediate step of a method of forming a first device pattern and a second device pattern through a block first SIT process, following the step shown in FIG. 1, according to one embodiment. More specifically, the method can include transferring the block pattern 120 into underlying layers, for example, the block ARC layer 108 and the mandrel planarization layer 106. Transferring of the block pattern 120 in the present step can be performed by etching the block ARC layer 108 and the block planarization layer 106 selective to the second hardmask layer 116. A directional etching technique such as a reactive-ion-etching technique can be used to etch the block ARC layer 108 and the block planarization layer 106. In one embodiment, the block ARC layer 108 can be etched with a reactive-ion-etching technique using a fluorocarbon based etchant, and the block planarization layer 106 can be etched with a reactive-ion-etching technique using an oxygen based etchant. In the present step, the photoresist layer 118 can function as a mask during etching of the block ARC layer 108, and be removed during etching of the block planarization layer 106. In this instance, the block ARC layer 108 can function as a mask during etching of the block planarization layer 106. Further, the second hardmask layer 116 can function as an etch-stop layer during etching of the block planarization layer 106.

Figure 3:
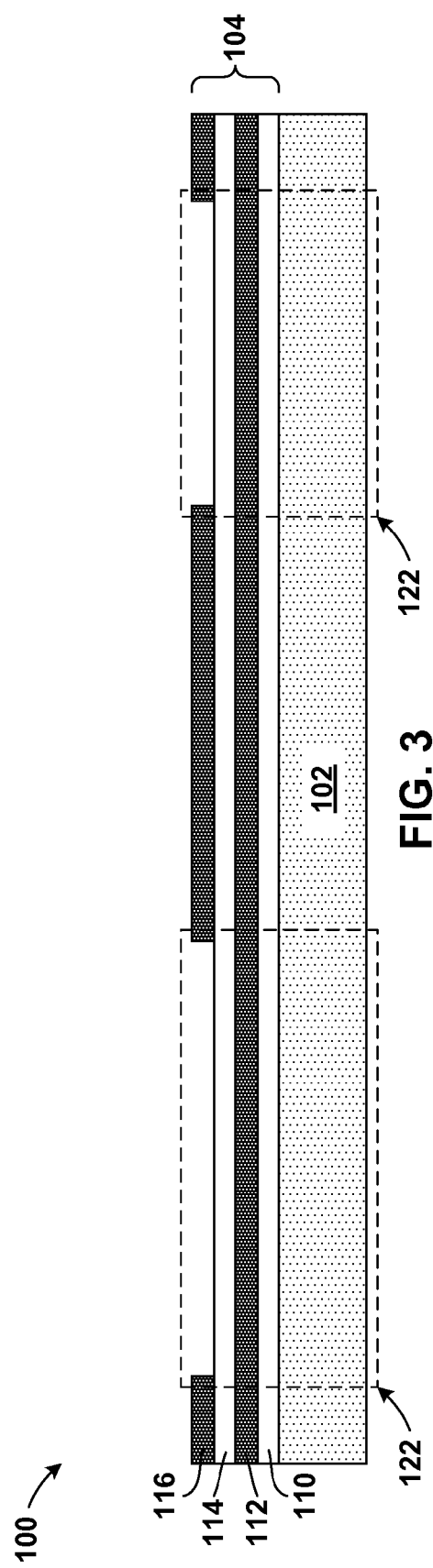
FIG. 3 illustrates transferring the block pattern into second hardmask layer of a tetra-layer hardmask according to an exemplary embodiment.

FIG. 3 is a demonstrative illustration of a structure during an intermediate step of a method of forming a first device pattern and a second device pattern through a block first SIT process, following the step shown in FIG. 2, according to one embodiment. More specifically, the method can include transferring the block pattern 120 (FIG. 2) into the second hardmask layer 116. Transferring of the block pattern 120 (FIG. 2) in the present step can be performed by etching the second hardmask layer 116 selective to the second patterning layer 114. A directional etching technique such as a reactive-ion-etching technique can be used to etch the second hardmask layer 116. In one embodiment, the second hardmask layer 116 can be etched with a reactive-ion-etching technique using a fluorocarbon gas based breakthrough step first, then followed by chlorine based etchant. In the present step, the block ARC layer 108 will be thinned or removed during the breakthrough step, and the block planarization layer 106 can function as the primary mask for etching of the second hardmask layer 116.

Thereafter, the block planarization layer 106 (FIG. 2) can be removed or lifted off. The block planarization layer 106 (FIG. 2) can be stripped or removed with either a wet clean technique, for example SP clean, or with a plasma etching technique using an oxygen based plasma. In the present embodiment, the block pattern 120 (FIG. 2) is transferred in the pattern region 122 of the structure 100. As described above, the first and second device patterns will be transferred to the substrate 102 only in the pattern region 122. Generally, the substrate 102 will not subsequently be patterned in any region blocked by the block pattern 120 (FIG. 2).

Figure 4:
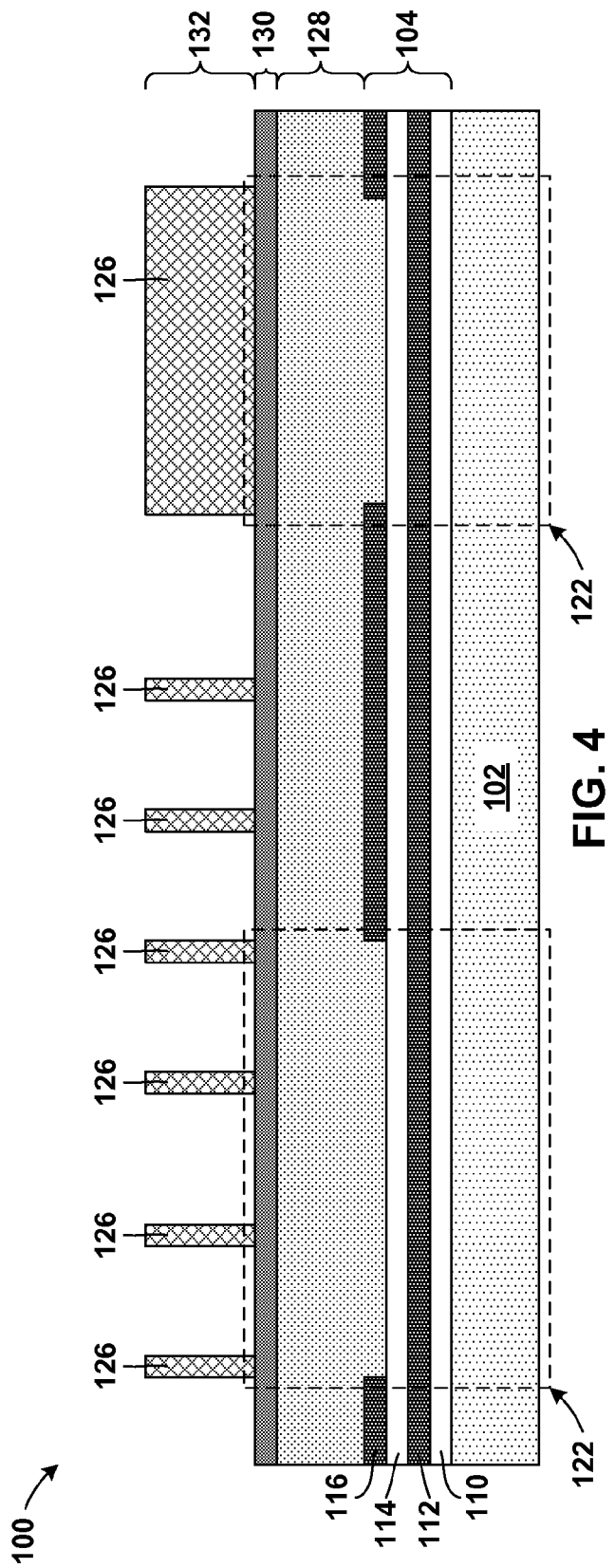
FIG. 4 illustrates the formation of a mandrel above a mandrel ARC layer according to an exemplary embodiment.

FIG. 4 is a demonstrative illustration of a structure during an intermediate step of a method of forming the first device pattern and the second device pattern through a block first SIT process, following the step shown in FIG. 3, according to one embodiment. More specifically, the method can include forming a mandrel 126 above a mandrel planarization layer 128 and a mandrel anti-reflective coating layer 130 (hereinafter "mandrel ARC layer"). The mandrel planarization layer 128 can be substantially similar to the block planarization layer 106 (FIG. 2) described in detail above, and the mandrel ARC layer 130 can be substantially similar to the block ARC layer 108 (FIG. 2) also described in detail above.

During this step, a second photo-resist layer 132 can be formed on top of the mandrel ARC layer 130. The second photo-resist layer 132 can be substantially similar to the first photo-resist layer 118 (FIG. 2) described in detail above. Like above, the particular photo-resist material chosen can partly depend upon the desired pattern to be formed and the exposure method used. The second photo-resist layer 132 can then be lithographically exposed and developed to create the mandrel 126. The mandrel 126 can be formed by applying any appropriate photo-exposure method suitable to the type of photo-resist layer being used, as is well known in the art.

Figure 5:
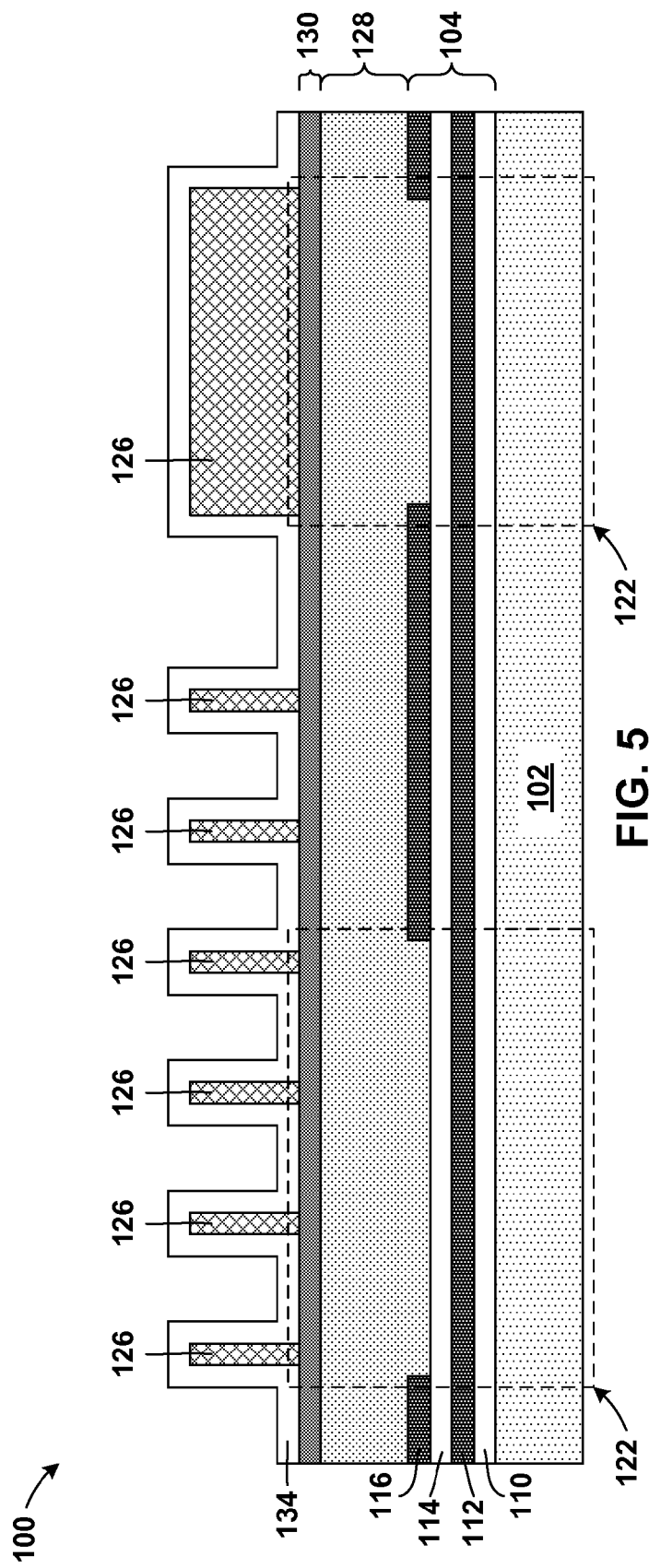
FIG. 5 illustrates the formation of a dielectric layer above the mandrel and the mandrel ARC layer according to an exemplary embodiment.

FIG. 5 is a demonstrative illustration of a structure during an intermediate step of a method of forming a first device pattern and a second device pattern through a block first SIT process, following the step shown in FIG. 4, according to one embodiment. More specifically, the method can include depositing a layer of dielectric material 134 (hereinafter "dielectric layer") directly on top of the mandrel ARC layer 130 and the mandrel 126. In one embodiment, the dielectric layer 134 can include, for example, silicon nitride or low temperature silicon oxide. The dielectric layer 134 can be deposited with a conformal deposition technique, using any known atomic layer deposition technique, molecular layer deposition techniques, or future developed deposition technique. In one embodiment, the dielectric layer 134 can have a substantially uniform thickness. In one embodiment, the dielectric layer 134 can have a conformal and uniform thickness ranging from about 10 nm to about 50 nm.

In an alternative embodiment, a pattern of the mandrel 126 can be lithographically transferred into an underlayer first before depositing the dielectric layer 134, as described above. Doing so can reduce the transfer of defects in the mandrel 126 at tight pitches, for example less than 22 nm.

Figure 6:
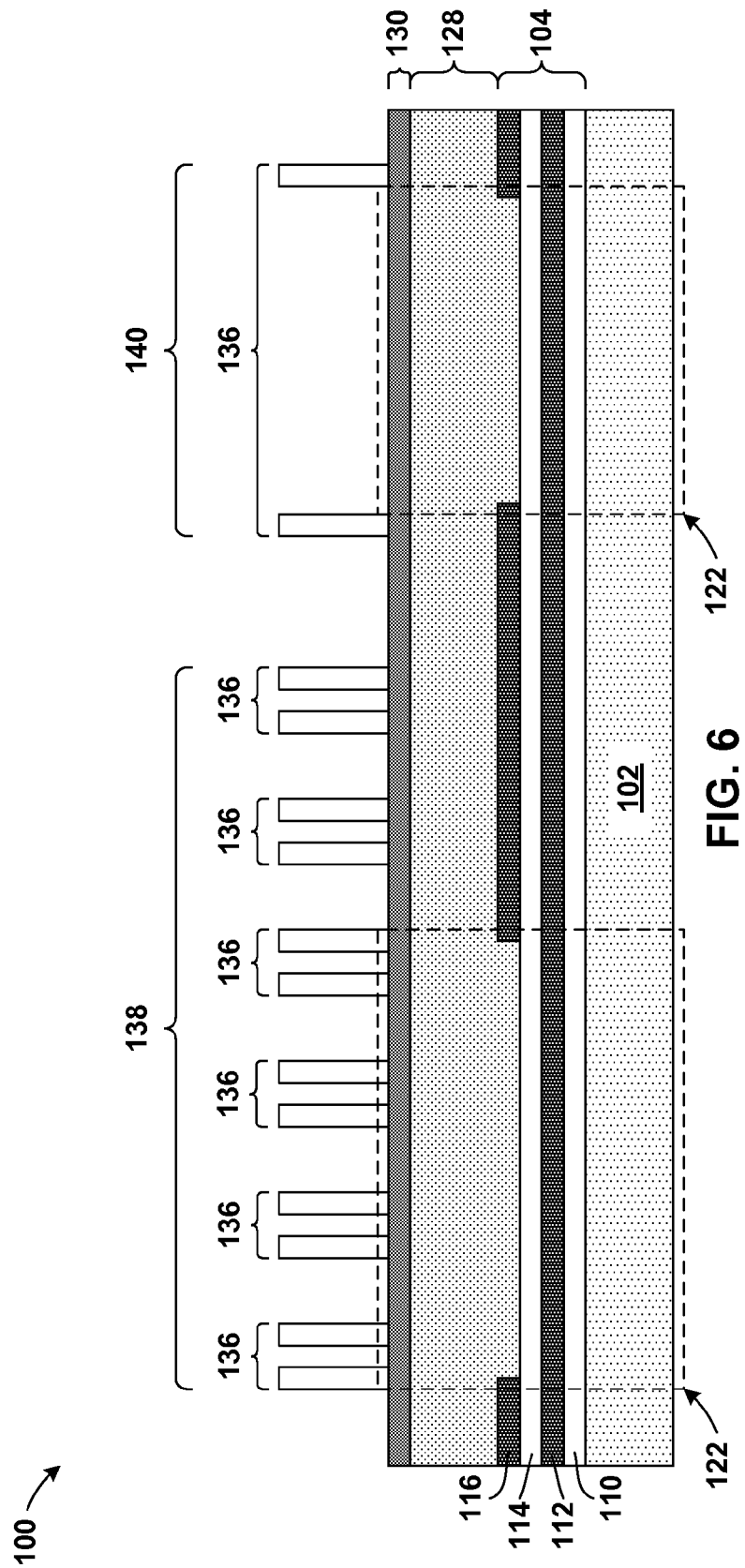
FIG. 6 illustrates a first device pattern and a second device pattern formed from sidewall spacers according to an exemplary embodiment.

FIG. 6 is a demonstrative illustration of a structure during an intermediate step of a method of forming a first device pattern and a second device pattern through a block first SIT process, following the step shown in FIG. 5, according to one embodiment. More specifically, the method can include forming sidewall spacers 136 by subjecting the dielectric layer 134 (FIG. 5) to a directional etching process such as a reactive-ion-etching technique. The directional etching process can remove most of the dielectric layer 134 (FIG. 5) from the top of the mandrel ARC layer 130 and from the top of the mandrel 126 (FIG. 5). A portion of the dielectric layer 134 (FIG. 5) can remain along the sidewalls of the mandrel 126 (FIG. 5), forming the sidewall spacers 136. Here, it should be noted that the sidewall spacers 136 depicted in FIG. 6 are for illustration purposes and generally can have a slightly different shape from those shown. For example, the sidewall spacers 136 can have rounded corners that can be naturally formed during the directional etching process as is known in the art. The sidewall spacers 136 define a first device pattern 138 and a second device pattern 140 which, ultimately can be transferred into the underlying substrate 102.

After directional etching of the dielectric layer 134 (FIG. 5) and formation of the sidewall spacers 136, the mandrel 126 (FIG. 5) can be pulled out or removed. In one embodiment, the mandrel 126 can be removed using an oxygen-containing plasma in which the sidewall spacers 136 won't be trimmed. As described above, and in one embodiment, the first device pattern 138 can represent fabrication of an interconnect structure, and the second device pattern 140 can represent fabrication of an alignment mark.

Figure 7:
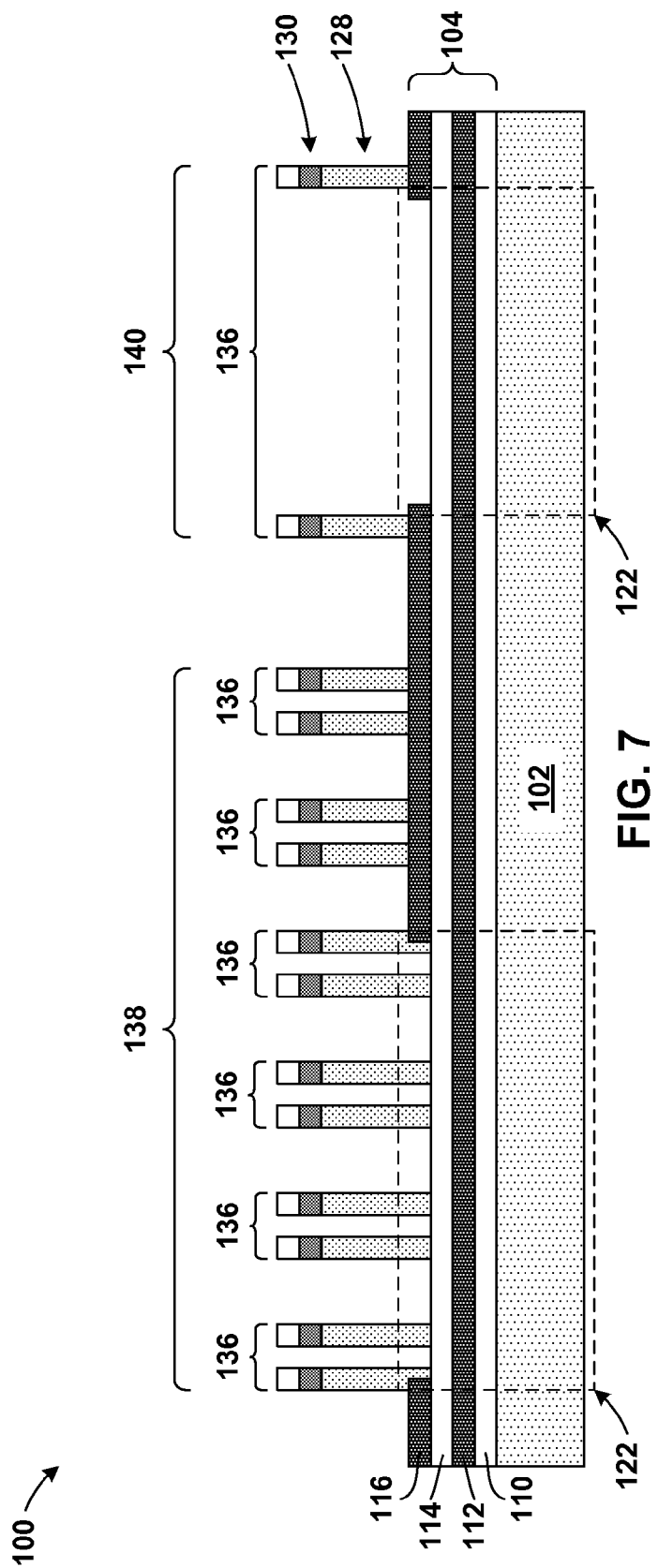
FIG. 7 illustrates transferring the first and second device patterns to the mandrel ARC layer and a mandrel planarization layer according to an exemplary embodiment.

FIG. 7 is a demonstrative illustration of a structure during an intermediate step of a method of forming a first device pattern and a second device pattern through a block first SIT process, following the step shown in FIG. 6, according to one embodiment. More specifically, the method can include transferring the first and second device patterns 138, 140 of the sidewall spacers 136, into underlying layers, for example, the mandrel ARC layer 130 and the mandrel planarization layer 128. Transferring of the first and second device patterns 138, 140 in the present step can be performed by etching the mandrel ARC layer 130 and the mandrel planarization layer 128 selective to the second hardmask layer 116 and the second patterning layer 114. A directional etching technique such as a reactive-ion-etching technique can be used to etch the mandrel ARC layer 130 and the mandrel planarization layer 128. In one embodiment, the mandrel ARC layer 130 can be etched with a reactive-ion-etching technique using a fluorocarbon based etchant, and the mandrel planarization layer 128 can be etched with a reactive-ion-etching technique using an oxygen based etchant. In the present step, the sidewall spacers 136 can function as a mask, and both the second hardmask layer 116 and the second patterning layer 114 can function as etch-stop layers during the etching of the mandrel planarization layer 128. It should be noted that some portion of the sidewall spacers 136 can be removed during etching of the mandrel ARC layer 130 and the mandrel planarization layer 128. Thus, the sidewall spacers 136 can be shorter in height after etching the mandrel ARC layer 130 and the mandrel planarization layer 128.

Figure 8:
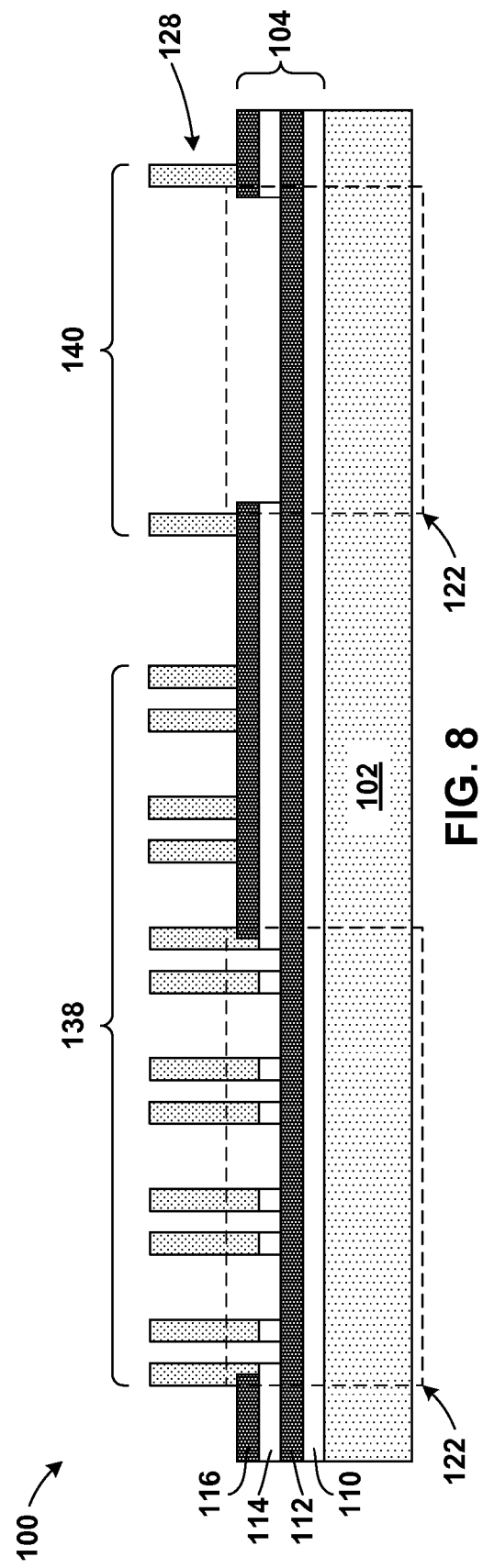
FIG. 8 illustrates transferring the first and second device patterns from the mandrel ARC layer and the mandrel planarization layer to a second patterning layer according to an exemplary embodiment.

FIG. 8 is a demonstrative illustration of a structure during an intermediate step of a method of forming the first device pattern 138 and the second device 140 pattern through a block first SIT process, following the step shown in FIG. 7, according to one embodiment. More specifically, the method can include transferring the first and second device patterns 138, 140 from the mandrel planarization layer 128 to the second patterning layer 114. Transferring the first and second device patterns 138, 140 in the present step can be performed by etching the second patterning layer 114 selective to the first and second hardmask layers 112, 116. A directional etching technique such as a reactive-ion-etching technique can be used to etch the second patterning layer 114. In one embodiment, the second patterning layer 114 can be etched with a reactive-ion-etching technique using a fluorocarbon based etchant. In the present step, the mandrel planarization layer 128 can function as a mask, and both the first and second hardmask layers 112, 116 can function as etch-stop layers during the etching of the second patterning layer 114.

More specifically, the second hardmask layer 116 can function as an etch-stop layer and prevent the transfer of the first and second device patterns 138, 140 into any region of the structure 100 other than the pattern region 122. Therefore, as a result of the block patterning step described above and the presence of the second hardmask layer 116, the first and second device patterns 138, 140 can only be transferred into the pattern region 122 of the structure 100.

Furthermore, the sidewall spacers 136 (FIG. 7) and the mandrel ARC layer 130 (FIG. 7) can be simultaneously removed during transferring the first and second device patterns 138, 140 into the second patterning layer 114. After transferring the first and second device patterns 138, 140 into the second patterning layer 114, the mandrel planarization layer 128 can be completely removed using any suitable etching or cleaning technique known in the art. In one embodiment, the mandrel planarization layer 128 can be removed with an etching technique using an oxygen based etchant.

Figure 9:
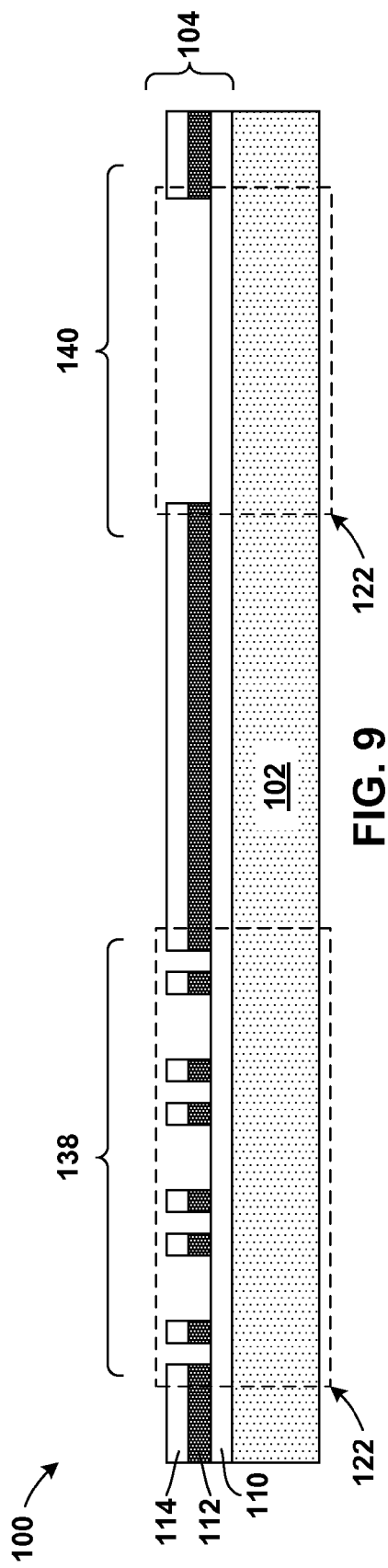
FIG. 9 illustrates transferring the first and second device patterns from the second patterning layer to a first hardmask layer according to an exemplary embodiment.

FIG. 9 is a demonstrative illustration of a structure during an intermediate step of a method of forming the first device pattern 138 and the second device pattern 140 through a block first SIT process, following the step shown in FIG. 8, according to one embodiment. More specifically, the method can include transferring the first and second device patterns 138, 140 from the second patterning layer 114 to the first hardmask layer 112 selective to the first patterning layer 110 Transferring the first and second device patterns 138, 140 in the present step can be performed by etching the first hardmask layer 112. A directional etching technique such as a reactive-ion-etching technique can be used to etch the first hardmask layer 112. In one embodiment, the first hardmask layer 112 can be etched with a reactive-ion-etching technique using a fluorocarbon plasma breakthrough step, followed by a chlorine based etchant. In the present step, the second patterning layer 114 can function as a mask, and the first patterning layer 110 can function as an etch-stop layer during the etching of the first hardmask 112. Furthermore, the second hardmask layer 116 (FIG. 8) can be simultaneously removed during transferring the first and second device patterns 138, 140 into the first hardmask layer 112.

FIG. 10 is a demonstrative illustration of a structure during an intermediate step of a method of forming a first device pattern 138 and a second device pattern 140 through a block first SIT process, following the step shown in FIG. 9, according to one embodiment. More specifically, the method can include transferring the first and second device patterns 138, 140 from the first hardmask 112 (FIG. 9) to the substrate 102. Transferring the first and second device patterns 138, 140 in the present step can be performed by etching the first patterning layer 110 and the substrate 102 to a desired depth. The desired depth can depend on the ultimate function of the structure 100. A directional etching technique such as a reactive-ion-etching technique can be used to etch the first patterning layer 110 and the substrate 102. In one embodiment, the first patterning layer 110 and the substrate 102 can be etched with a reactive-ion-etching technique using a fluorocarbon based etchant. In the present step, the first hardmask layer 112 (FIG. 9) can function as a mask, and can have a high etch-selectivity relative to the first patterning layer 110 and the substrate 102. Furthermore, the first hardmask layer 112 (FIG. 9) and the first patterning layer 110 can be removed in subsequent steps using any suitable removal technique known in the art.

FIG. 11 is a demonstrative illustration of a final structure of a method of forming a first device pattern 138 (FIG. 10) and a second device pattern 140 (FIG. 10) through a block first SIT process, following the step shown in FIG. 10, according to one embodiment. More specifically, the final structure can include an interconnect structure 142 and an alignment mark 144 formed by filling the first device pattern 138 (FIG. 10) and the second device pattern 140 (FIG. 10) with a conductive interconnect material. In one embodiment, typical processing techniques known in the art can be used to fill the first and second device patterns 138, 140 with a conductive interconnect material to form the interconnect structure 142 and the alignment mark 144. It should be noted that the method of forming the first device pattern 138 and the second device pattern 140 through a block first SIT process is not limited to the formation of an interconnect structure and an alignment mark. In one embodiment, one or more fins may be formed in a semiconductor material in order to fabricate a fin field effect transistor device.

The above described block first SIT technique can have distinct advantages over other comparable techniques. The process window of the block first SIT technique described above is not artificially restricted by the height of the sidewall spacers 136 (FIG. 6) because the second hardmask layer 116 (FIG. 6) prevents the sidewall spacers 136 (FIG. 6) outside the pattern region 122 from being transferred to the underlying substrate 102. Additionally, the block first SIT technique can produce a solid alignment mark, as opposed to segmented or hollow alignment marks generally produced during comparable SIT transfer techniques. The solid alignment mark offers higher contrast allowing for improved alignment between processing steps.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a tetra-layer hardmask comprising a second hardmask layer above a first hardmask layer;
   defining a pattern region in the second hardmask layer;
   forming an interconnect pattern and an alignment mark pattern above the tetra-layer hardmask; and
   transferring the interconnect pattern and the alignment mark pattern into a substrate below the tetra-layer hardmask, wherein the interconnect pattern and the alignment mark pattern are transferred into the substrate only in the pattern region defined by the second hardmask layer.

2. The method of claim 1, wherein defining the pattern region is accomplished using a lithographic masking and etching technique.

3. The method of claim 1, wherein defining the pattern region in the second hardmask layer comprises:
   depositing a block anti-reflective coating (ARC) layer and a block planarization layer above the tetra-layer hardmask;
   depositing a photo-resist material above the block ARC layer;
   forming a block pattern, lithographically, in the photo-resist material;
   transferring the block pattern into the second hardmask layer; and
   removing the block ARC layer and the block planarization layer after transferring the block pattern into the second hardmask layer.

4. The method of claim 1, wherein transferring the interconnect pattern and the alignment mark pattern is accomplished using a sidewall image transfer technique.

5. The method of claim 1, wherein transferring the interconnect pattern and the alignment mark pattern into the substrate below the tetra-layer hardmask comprises:
   transferring the interconnect pattern and the alignment mark pattern into a mandrel ARC layer above a mandrel planarization layer above the tetra-layer hardmask;
   transferring the interconnect pattern and the alignment mark pattern from the mandrel ARC layer into the mandrel planarization layer;
   transferring the interconnect pattern and the alignment mark pattern from the mandrel planarization layer into the first hardmask layer; and
   transferring the interconnect pattern and the alignment mark pattern from the first hardmask layer into the substrate.

6. The method of claim 1, wherein forming the tetra-layer hardmask comprises:
   forming a first patterning layer above and in direct contact with the substrate;
   forming the first hardmask layer above and in direct contact with the first patterning layer;
   forming a second patterning layer above and in direct contact with the first hardmask layer; and
   forming the second hardmask layer above and in direct contact with the second patterning layer.

7. A method comprising:
   forming a tetra-layer hardmask above and in direct contact with a substrate, the tetra-layer hardmask comprising a first patterning layer, a first hardmask layer, a second patterning layer, and a second hardmask layer all of which are formed one top of one another and in sequence;
   forming a block pattern from a photo-resist material above the tetra-layer hardmask;
   transferring the block pattern from the photo-resist material into the second hardmask layer, wherein the block pattern in the second hardmask layer defines a pattern region;
   forming an interconnect pattern and an alignment mark pattern using a set of sidewall spacers above the second hardmask layer;
   transferring the interconnect pattern and the alignment mark pattern into the first hardmask layer, only within the pattern region; and
   transferring the interconnect pattern and the alignment mark pattern into the substrate, only within the pattern region.

8. The method of claim 7, wherein transferring the block pattern from the photo-resist layer above the tetra-layer hardmask into the second hardmask layer comprises:
   depositing a block anti-reflective coating (ARC) layer above a block planarization layer above the tetra-layer hardmask;
   depositing the photo-resist layer above the block ARC layer;
   forming the block pattern, lithographically, in the photo-resist; and removing the block ARC layer and the block planarization layer after transferring the block pattern into the second hardmask layer.

9. The method of claim 7, wherein transferring the interconnect pattern and the alignment mark into the first hardmask layer comprises:
    transferring the interconnect pattern and the alignment mark pattern into a mandrel ARC layer above a mandrel planarization layer above the tetra-layer hardmask;
    transferring the interconnect pattern and the alignment mark pattern from the mandrel ARC layer into the mandrel planarization layer; and
    transferring the interconnect pattern and the alignment mark pattern from the mandrel planarization layer into the first hardmask layer.

10. The method of claim 1, wherein transferring the interconnect pattern and the alignment mark pattern into the substrate below the tetra-layer hardmask comprises:
    transferring the interconnect pattern and the alignment mark pattern into a mandrel ARC layer above a mandrel planarization layer above the tetra-layer hardmask;
    transferring the interconnect pattern and the alignment mark pattern from the mandrel ARC layer into the mandrel planarization layer; and
    transferring the interconnect pattern and the alignment mark pattern from the mandrel planarization layer into the first hardmask layer.

11. The method of claim 1, wherein transferring the interconnect pattern and the alignment mark pattern into the substrate below the tetra-layer hardmask comprises:
    transferring the interconnect pattern and the alignment mark pattern into a mandrel ARC layer above a mandrel planarization layer above the tetra-layer hardmask; and
    transferring the interconnect pattern and the alignment mark pattern from the mandrel ARC layer into the mandrel planarization layer.

12. The method of claim 1, wherein transferring the interconnect pattern and the alignment mark pattern into the substrate below the tetra-layer hardmask comprises:
    transferring the interconnect pattern and the alignment mark pattern into a mandrel ARC layer above a mandrel planarization layer above the tetra-layer hardmask.

13. The method of claim 1, further comprising:
    depositing a metal within the interconnect pattern and the alignment mark pattern in the substrate.

14. The method of claim 7, wherein transferring the interconnect pattern and the alignment mark pattern is accomplished using a sidewall image transfer technique.

15. The method of claim 7, wherein transferring the interconnect pattern and the alignment mark pattern into the first hardmask layer comprises:
    transferring the interconnect pattern and the alignment mark pattern into a mandrel ARC layer above a mandrel planarization layer above the tetra-layer hardmask; and
    transferring the interconnect pattern and the alignment mark pattern from the mandrel ARC layer into the mandrel planarization layer.

16. The method of claim 7, wherein transferring the interconnect pattern and the alignment mark pattern into the first hardmask layer comprises:
    transferring the interconnect pattern and the alignment mark pattern into a mandrel ARC layer above a mandrel planarization layer above the tetra-layer hardmask.

17. The method of claim 7, further comprising:
    depositing a metal within the interconnect pattern and the alignment mark pattern in the substrate.

* * * * *